United States Patent
Garros et al.

(10) Patent No.: US 8,525,528 B2
(45) Date of Patent: Sep. 3, 2013

(54) METHOD AND DEVICE FOR EVALUATING ELECTRIC PERFORMANCES OF AN FDSOI TRANSISTOR

(75) Inventors: Xavier Garros, Grenoble (FR); Laurent Brunet, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 179 days.

(21) Appl. No.: 12/860,253

(22) Filed: Aug. 20, 2010

(65) Prior Publication Data

US 2011/0050253 A1  Mar. 3, 2011

(30) Foreign Application Priority Data

Aug. 28, 2009  (FR) .................................. 09 55895

(51) Int. Cl.
- *G01R 27/26* (2006.01)
- *G01R 29/12* (2006.01)
- *G01R 31/12* (2006.01)
- *G01R 25/00* (2006.01)
- *G01N 27/60* (2006.01)

(52) U.S. Cl.
USPC ........... 324/658; 324/457; 324/686; 324/456; 324/548; 257/324; 257/347; 257/351; 257/350; 702/65

(58) Field of Classification Search
USPC ........................................................ 324/658
See application file for complete search history.

(56) References Cited

U.S. PATENT DOCUMENTS

| | | | |
|---|---|---|---|
| 7,030,043 B2 | 4/2006 | Damlencourt et al. | |
| 7,127,384 B2 * | 10/2006 | Zolotov et al. | 703/14 |
| 7,404,157 B2 * | 7/2008 | Tanabe | 324/762.09 |
| 2008/0135924 A1 | 6/2008 | Lebby et al. | |
| 2008/0277729 A1 * | 11/2008 | Gossner et al. | 257/360 |
| 2009/0132974 A1 | 5/2009 | Yoshimoto et al. | |
| 2011/0050253 A1 | 3/2011 | Garros et al. | |

FOREIGN PATENT DOCUMENTS

EP  1 591 558 A1  11/2005

OTHER PUBLICATIONS

L. Brunet, X. Barros, F. Andrieu, G. Reimbold, E. Vincent, A. Bravaix and F. Boulanger, New Method to extract interface states density at the back and the Front gate interfaces of FDSOI transistors from CV-GV measurements, IEEE conference Publication, Conference Publications, Oct. 5-8, 2009.*

A. Vandooren, A. Barr, L. Mathew, T.R. White, S. Egley, D. Pham, M. Zavala, S. Samavedam, J. Schaeffer, J. Conner, B.-Y. Nguyen, Bruce E. White, Jr. Marius K. Orlowski, and J. Mogab, Fully-Depleted SOI Devices with TaSiN Gate, HfO2 Gate Dielectric, and Elevated Source/Drain Extensions, IEEE Electron Device Letters, vol. 24, No. 5, May 2003, 342-.*

STIC Search Report.*

(Continued)

*Primary Examiner* — Jermele M Hollington
*Assistant Examiner* — Christopher McAndrew
(74) *Attorney, Agent, or Firm* — Oblon, Spivak, McClelland, Maier & Neustadt, L.L.P.

(57) ABSTRACT

A method for evaluating the electric performances of an FDSOI transistor, including the steps of: measuring capacitance and/or conductance of the FDSOI transistor, by applying a voltage $V_{BG}>0$ on a substrate composed of semiconductor of the FDSOI transistor when the FDSOI transistor is NMOS or a voltage $V_{BG}<0$ on the substrate composed of semiconductor of the FDSOI transistor when the FDSOI transistor is PMOS, depending on a voltage $V_{FG}$ applied between a gate and source and drain regions of the FDSOI transistor.

11 Claims, 4 Drawing Sheets

(56) References Cited

OTHER PUBLICATIONS

Figure 1:
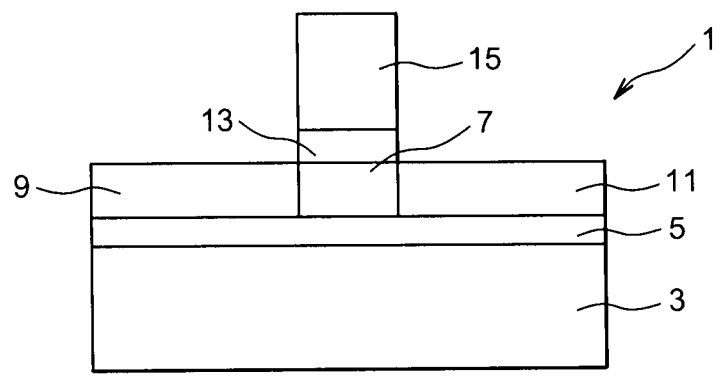

French Preliminary Search Report issued Apr. 29, 2010, in Patent Application No. 0955895 (Translation of Category of Cited Documents in the attached foreign language Search Report).

K. Romanjek, et al., "High-k/metal Gate GeO1 pMOSFET: Validation of the Lim&Fossum Model for Interface Trap Density Extraction", IEEE International SOI Conference Proceedings, Oct. 6, 2008, pp. 147-148.

P. Batude, et al., "Insights on fundamental mechanisms impacting Ge metal oxide semiconductor capacitors with high-k/metal gate stacks", Journal of Applied Physics, vol. 102, No. 3, Aug. 15, 2007, pp. 034514-1-034514-8.

Takeo Ushiki, et al., "Evidence of Energetically-Localized Trap-States at SOI-BOX Interface in High-Dose SIMOX Wafers", IEEE International SOI Conference, Oct. 1999, pp. 48-49.

Hyung-Kyu Lim, et al., "Threshold Voltage of Thin-Film Silicon-on-Insulator (SOI) MOSFET's", IEEE Transactions on Electron Devices, vol. ED-30, No. 10, XP 000579751, Oct. 1, 1983, pp. 1244-1251.

Koen Martens et al., "On the Correct Extraction of Interface Trap Density of MOS Devices With High-Mobility Semiconductor Substrates", IEEE Transactions on Electron Devices, vol. 55, No. 2, Feb. 1, 2008, pp. 547-556.

D. Bozyigit, et al., "On the extraction of interface trap density in the Pt/$La_2O_3$/Ge gate stack and the determination of the charge neutrality level in Ge", Journal of Applied Physics, vol. 105, No. 12, Jun. 26, 2009, pp. 124521.

Thierry Ouisse, et al., "Adaptation of the Charge Pumping Technique to Gated p-i-n. Diodes Fabricated on Silicon on Insulator", IEEE Transactions on Electron Devices, vol. 38, No. 6, Jun. 1991, pp. 1432-1444.

Dirk J. Wouters, et al., "Characterization of Front and Back Si-$SiO_2$ Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Dragica Vasileska, et al., "Scaled Silicon MOSFET's: Degradation of the Total Gate Capacitance", IEEE Transactions on Electron Devices, vol. ED-44, No. 4, Apr. 1997, pp. 584-587.

Sorin Cristoloveanu, et al., "Electrical Characterization of Silicon-On-Insulator Materials and Devices", Kluwer Academic Publishers, 1995, pp. 240-255.

E.H. Nicollian, et al., "MOS Physics and Technology", Wiley, New-York, 1982, pp. 176-207.

U.S. Appl. No. 13/760,436, filed Feb. 6, 2013, Garros, et al.

* cited by examiner

METHOD AND DEVICE FOR EVALUATING ELECTRIC PERFORMANCES OF AN FDSOI TRANSISTOR

TECHNICAL FIELD

The invention relates to a method and a device for evaluating the electric performances of FDSOI transistors, i.e. fully depleted transistors of the silicon-on-insulator type.

The invention is notably used for electrically characterizing the semiconducting dielectric interfaces of FDSOI transistors by evaluating the defect densities at these interfaces, the electric performances of FDSOI transistors being directly dependent on the quality of these interfaces and therefore on the defect densities present at these interfaces.

STATE OF THE PRIOR ART

An example of an FDSOI transistor 1 is illustrated in FIG. 1. The transistor 1 is made on an SOI (silicon-on-insulator) type substrate including a substrate 3 composed of a semiconductor, for example silicon, on which is positioned a dielectric layer 5 for example composed of $SiO_2$, forming a buried dielectric (BOX).

A semiconducting layer, such as silicon, in which a channel region 7 and source 9 and drain 11 regions are formed, is positioned on the dielectric layer 5. The channel 7 is covered by a gate dielectric 13 for example composed of $SiO_2$, on which is positioned a gate 15, for example composed of TiN.

The electric performances of such a transistor 1 of the FDSOI type are dependent on the quality of the silicon/$SiO_2$ interfaces, i.e. the interface between the silicon portion 7 intended to form the channel and the gate dielectric 13 called a front interface, and the interface between the silicon portion 7 and the buried dielectric 5, called a rear interface.

In order to evaluate the electric performances of this transistor 1, it is therefore necessary to be able to measure and quantify the density of defects at these front ($D_{it1}$) interfaces and rear ($D_{it2}$) interfaces.

There exist different methods for determining the densities of interface defects for a bulk transistor, i.e. a transistor made on a bulk semiconducting substrate not including any buried dielectric. Certain of these techniques may be adapted for transistors made on SOI substrates. But in this case, they are either not very accurate, or they require the use of adapted test structures.

A first method for electrically characterizing an SOI transistor consists of using the characteristic $I_D(V_g)$ of the transistor in order to calculate the slope under the threshold and to infer therefrom the interface state density, i.e. the densities of defects at the interfaces of the transistor. This characteristic is obtained by applying the voltage Vg on the gate of the transistor and measuring the current $I_D$ flowing out of the drain, the source being electrically connected to the ground. This first method has the drawbacks of being relatively inaccurate and not allowing evaluation of defect densities of less than $10^{11}$ defects/$cm^2$.

A second method, called a charge pumping technique, consists, when it is applied to a bulk transistor, of measuring the substrate current $I_B$ of the transistor which is proportional to the defect density between the semiconducting portion intended to form the channel and the gate dielectric. During this measurement, a square wave signal is applied on the gate of the transistor, the source and the drain being electrically connected to the ground. Although it is accurate, this method cannot be used on SOI transistors since it is not possible to measure a substrate current $I_B$ taking into account the buried dielectric present between the channel and the substrate composed of semiconductor.

In order to apply this method on SOI substrates and notably on FDSOI transistors, it is therefore necessary to use different specific test structures of FDSOI transistors and including dielectric-semiconductor interfaces similar to dielectric-semiconductor interfaces of transistors. These test structures may be diodes of the p-i-n type as described in document <<Adaptation of the Charge Pumping Technique to Gated p-i-n Diodes Fabricated on Silicon on Insulator>> of T. Ouisse et al., IEEE transactions on electron devices, 1991, Vol. 38, No. 6, pages 1432-1444. These test structures may also be transistors with a contacted substrate as described in document <<Characterization of Front and Back Si—$SiO_2$ Interfaces in Thick- and Thin-Film Silicon-on-Insulator MOS structures by the Charge-Pumping Technique>> of D. J. Wouters et al., IEEE transactions on electron devices, 1989, Vol. 36(1), No. 9, pages 1746-1750.

DISCUSSION OF THE INVENTION

Thus there is a need to propose a method for evaluating the electric performances of an FDSOI transistor allowing characterization of the defects present at an interface between a gate dielectric of the transistor and a semiconductor intended to form the channel of the transistor and at an interface between the semiconductor intended to form the channel of the transistor and a buried dielectric of the transistor, further allowing detection of defect densities of less than about $10^{11}$ defects/$cm^2$, which is accurate and which may be directly applied to FDSOI transistors without requiring specific test structures as required for the methods of the prior art.

For this, one embodiment proposes a method for evaluating the electric performances of an FDSOI transistor, including the steps of:

measuring the capacitance and/or the conductance of the FDSOI transistor, by applying a voltage $V_{BG}>0$ on a substrate composed of semiconductor of the FDSOI transistor when the FDSOI transistor is of the NMOS type or a voltage $V_{BG}<0$ on the substrate composed of semiconductor of the FDSOI transistor when the FDSOI transistor is of the PMOS type, depending on a voltage $V_{FG}$ applied between the gate and the source and drain regions of the FDSOI transistor, calculating theoretical values of the capacitance and/or of the conductance of a transistor modeled by an electric circuit equivalent to the FDSOI transistor, depending on the values of the voltages $V_{FG}$ and $V_{BG}$ applied to the modeled transistor and for different selected theoretical values of defect densities $D_{it1}$, $D_{it2}$ at an interface between a gate dielectric of the modeled transistor and a semiconductor intended to form the channel of the modeled transistor and an interface between the semiconductor intended to form the channel of the modeled transistor and a buried dielectric of the modeled transistor, respectively, determination of the real values of the defect densities $D_{it1}$, $D_{it2}$ at the corresponding interfaces of the FDSOI transistor by a comparison between the measured values of the capacitance and/or of the conductance of the FDSOI transistor and the calculated theoretical values of the capacitance and/or of the conductance of the modeled transistor for different selected theoretical values of the defect densities $D_{it1}$, $D_{it2}$ at the interfaces of the modeled transistor.

The step for calculating the theoretical values and the comparison made during the step for determining the real values of the defect densities may be carried out on the basis of the characteristics of the transistor (capacitance and/or conductance) which have been measured beforehand.

If the capacitance and the conductance of the transistor are measured during the measuring step, the subsequent steps for calculating the theoretical values and for determining the actual values of the defect densities may be carried out by using the capacitance and the conductance of the transistor, or else by only using either one of these characteristics.

On the other hand, if only one of the capacitance or conductance of the transistor is measured during the measuring step, the subsequent steps for calculating the theoretical values and determining the real values of the defect densities may then be carried out for the characteristic which has been measured, i.e. the capacitance or the conductance. However, nothing opposes carrying out a calculation of the theoretical values of the capacitance and of the conductance, although only one of the characteristics among the capacitance or the conductance is used during the determination of the real values of the defect densities.

The method is therefore based on measurements of capacitance and/or conductance of the FDSOI transistor while using electrostatic coupling existing between the front and rear interfaces of the transistor, the front interface corresponding to the interface between the gate dielectric of the transistor and the semiconductor intended to form the channel of the transistor, and the rear interface corresponding to the interface between the semiconductor intended to form the channel and the transistor and the buried dielectric of the transistor.

The method proposes, via the conducted measurements, to decorrelate the electric response of the defects of the front interface from that of the defects of the rear interface, and to use electric modeling of the transistor with which the actual values of the defect densities may be found again by comparing the results obtained by the measurement and by the modeling of the transistor.

Thus, with this method, it is notably possible to evaluate in a non-destructive way, the performances of an existing FDSOI transistor.

The theoretical values of the capacitance and/or the conductance of a transistor modeled by an electric circuit equivalent to the FDSOI transistor may notably be calculated depending on the experimental values of the voltages $V_{FG}$ and $V_{BG}$ applied to the modeled transistor.

The voltage $V_{FG}$ may include a DC component, the value of which may be comprised between about −2 V and 2 V and an alternating, or AC, sinusoidal component, the frequency of which may be comprised between about 10 kHz and 100 kHz and the amplitude of which may be comprised between about 30 mV and 40 mV.

The value of the voltage $V_{BG}$ may be selected such that a curve illustrating the measured conductance of the FDSOI transistor depending on the voltage $V_{FG}$ includes at least two peaks.

The voltage $V_{BG}$ may be a DC voltage, the value of which may be comprised between about 15 V and 30 V when the FDSOI transistor is of the NMOS type or comprised between about −15 V and −30 V when the FDSOI transistor is of the PMOS type.

The capacitance and/or the conductance of the FDSOI transistor may be measured by an impedance analyzer.

The electric circuit equivalent to the FDSOI transistor may include a first capacitance electrically connected in series with a set of components electrically connected in parallel with each other, said set of components may include four capacitances, which may correspond to inversion capacitances in the semiconductor intended to form the channel of the modeled transistor on the side of said interfaces of the modeled transistor and to capacitances of the defects at said interfaces of the modeled transistor, and two conductances which may correspond to conductances of the defects at said interfaces of the modeled transistor.

The calculated theoretical values of the capacitance and/or of the conductance may be obtained by applying the following steps:

calculating theoretical values of electron concentrations $n_{S1}$ and $n_{S2}$ at the interfaces of the modeled transistor, calculating theoretical values of the characteristic lifetimes of the defects $\tau_t$ and $\tau_2$ at the interfaces of the modeled transistor such that:

$$\tau_{1,2} = \sigma_{1,2} \cdot v_{th} \cdot n_{S1,2}$$

calculating theoretical values of capacitances $C_{it1}$ and $C_{it2}$ at the interfaces of the modeled transistor for the different theoretical values selected from $D_{it1}$ and $D_{it2}$ such that:

$$C_{it1,2} = e \cdot D_{it1,2} \frac{\arctan(\omega \tau_{1,2})}{\omega \tau_{1,2}}$$

calculating theoretical values of conductances $G_{it1}$ and $G_{it2}$ at the interfaces of the modeled transistor for the different theoretical values selected from $D_{it1}$ and $D_{it2}$ such that:

$$G_{it1,2} = e \cdot D_{it1,2} \frac{\ln(1 + (\omega \tau_{1,2})^2)}{2\omega \tau_{1,2}}$$

calculating the theoretical values of inversion charges $Q_{inv1}$ and $Q_{inv2}$ in the semiconductor intended to form the channel of the modeled transistor respectively of the side of each of the interfaces of the modeled transistor such that:

$$Q_{inv1} = -e \int_0^{T_{Si}/2} n(x)\,dx \text{ and } Q_{inv2} = -e \int_{T_{Si}/2}^{T_{Si}} n(x)\,dx$$

calculating theoretical values of electric potentials $\Psi_{S1}$ and $\Psi_{S2}$ in the semiconductor intended to form the channel of the modeled transistor respectively on the side of each of the interfaces of the modeled transistor, calculating theoretical values of inversion capacitances $C_{inv1}$ and $C_{inv2}$ in the semiconductor intended to form the channel of the modeled transistor respectively on the side of each of the interfaces of the modeled transistor such that:

$$C_{inv1,2} = \frac{dQ_{inv1,2}}{d\Psi_{S1,2}}$$

calculating the theoretical value of the admittance $Y_m$ of the modeled transistor such that:

$$Y_m = [(j\omega C_{ox})^{-1} + (j\omega(C_{inv1} + C_{inv2} + C_{it1} + C_{it2}) + G_{it1} + G_{it2})^{-1}]^{-1} = G_m + j\omega C_m$$

with:

$\sigma_{1,2}$: capture cross-sections at the interfaces of the modeled transistor;

$v_{th}$: thermal velocity of the charge carriers;

$\omega$: angular frequency of an alternating sinusoidal component of the voltage $V_{FG}$ applied to the modeled transistors;

n(x): concentration of electrons at depth x in the semiconductor intended to form the channel of the modeled transistor;

$C_{ox}$: capacitance of the gate dielectric of the modeled transistor;

$C_m$: capacitance of the modeled transistor;

$G_m$: conductance of the modeled transistor;

e: elementary charge;

$T_{Si}$: thickness of the semiconductor intended to form the channel of the transistor.

The theoretical values of the electron concentrations $n_{S1}$ and $n_{S2}$ and of the electric potentials $\Psi_{S1}$ and $\Psi_{S2}$ at the interfaces of the modeled transistor may be calculated by a software of the Poisson Schrödinger solver type from values of the thickness of the semiconductor intended to form the channel of the modeled transistor, from the doping of said semiconductor, from the $SiO_2$ equivalent oxide thickness EOT of the modeled transistor, and from the voltage $V_{BG}$.

Comparison between the measured conductance of the FDSOI transistor and the calculated theoretical conductance of the modeled transistor may be achieved by plotting and superposing curves of these conductances depending on the voltage $V_{FG}$, and then by determining the selected theoretical values of the defect densities $D_{it1}$, $D_{it2}$ at the interfaces of the modeled transistor for which the calculated theoretical conductance curve includes two peaks substantially superposed onto two peaks of the measured conductance curve.

The comparison between the measured capacitance of the FDSOI transistor and the calculated theoretical capacitance of the modeled transistor may be achieved by plotting and superposing curves of these capacitances depending on the voltage $V_{FG}$, and then by determining the selected theoretical values of the defect densities $D_{it1}$, $D_{it2}$ at the interfaces of the modeled transistor for which the calculated theoretical capacitance curve includes two inflection points substantially superposed to two inflection points of the measured capacitance curve.

It is also proposed a device for evaluating the electric performances of an FDSOI transistor, including means for applying a method for evaluating electric performances of an FDSOI transistor as described above.

SHORT DESCRIPTION OF THE DRAWINGS

Figure 2:
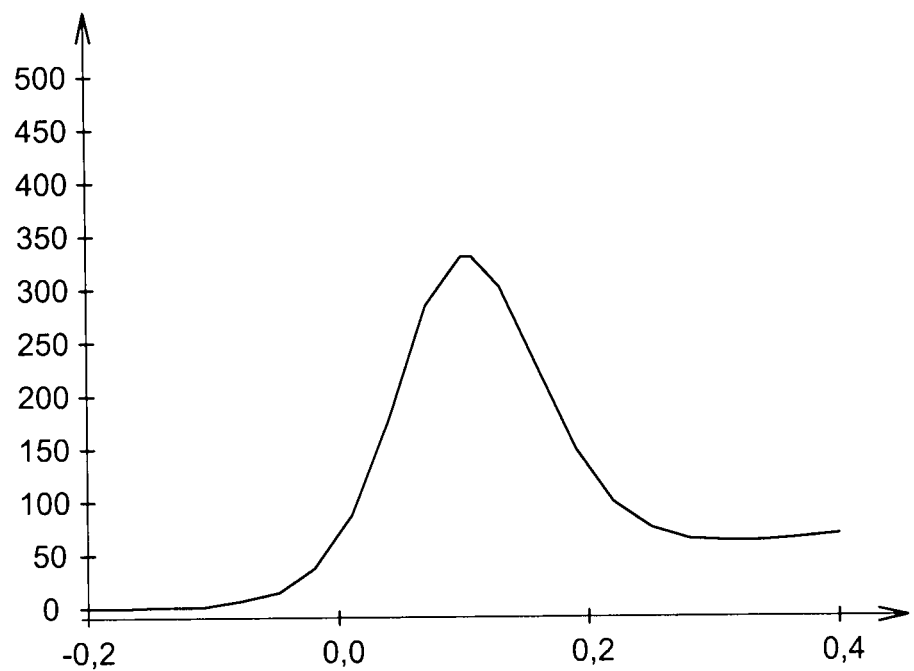
Figure 3:
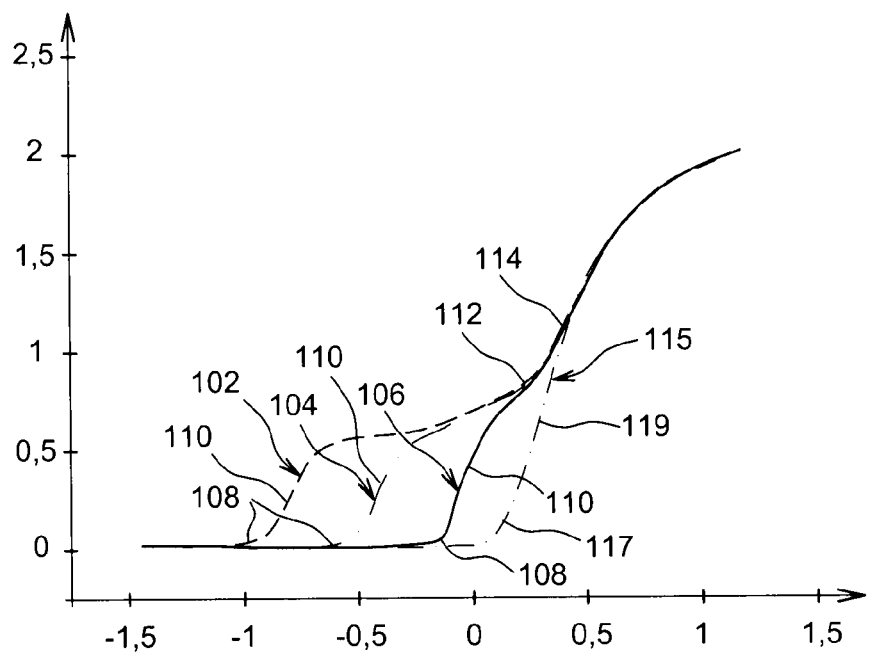
Figure 4:
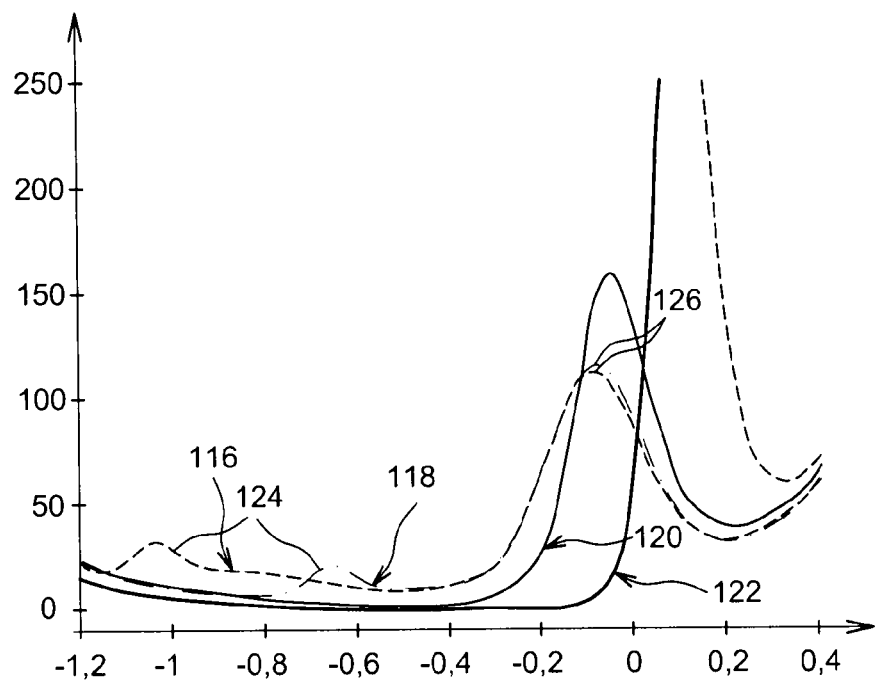
Figure 5:
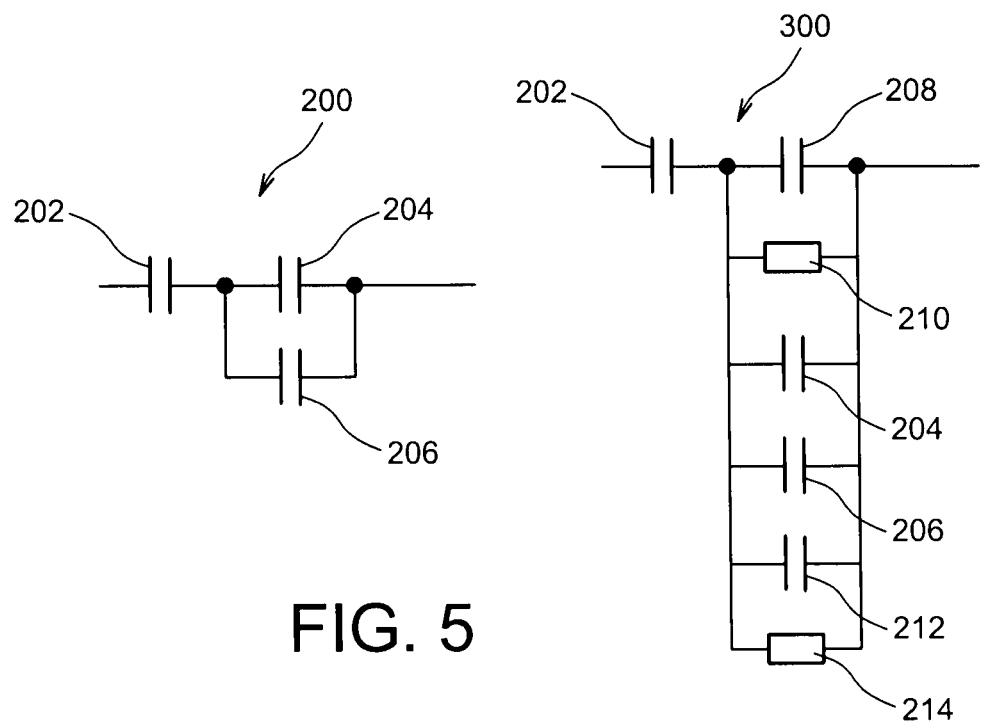
Figure 6:
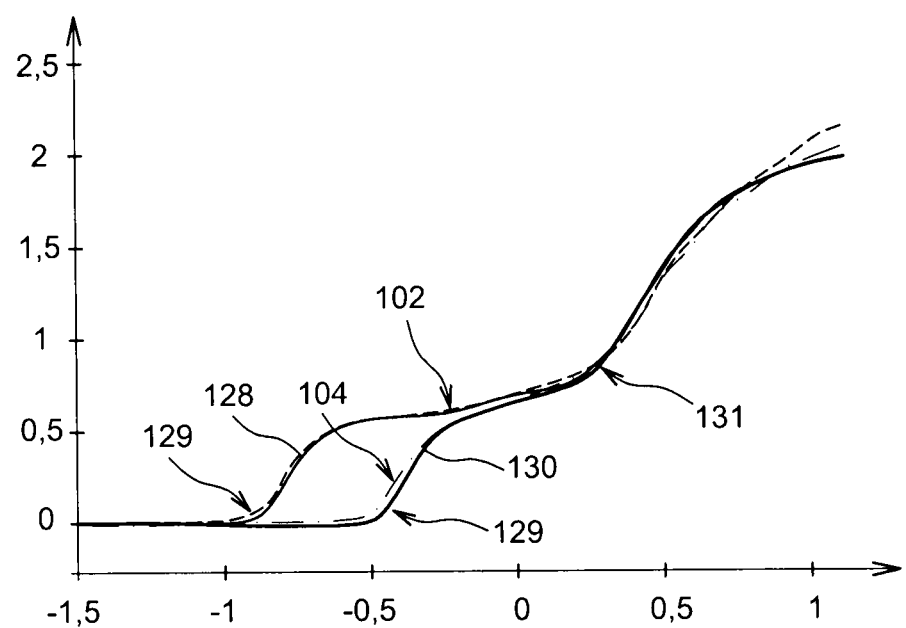
Figure 7:
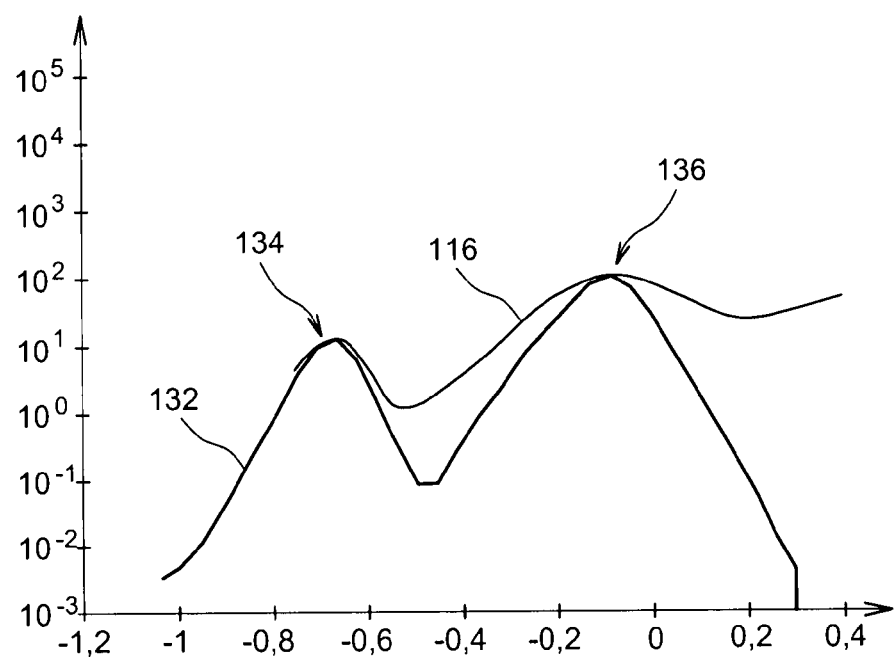
Figure 8:
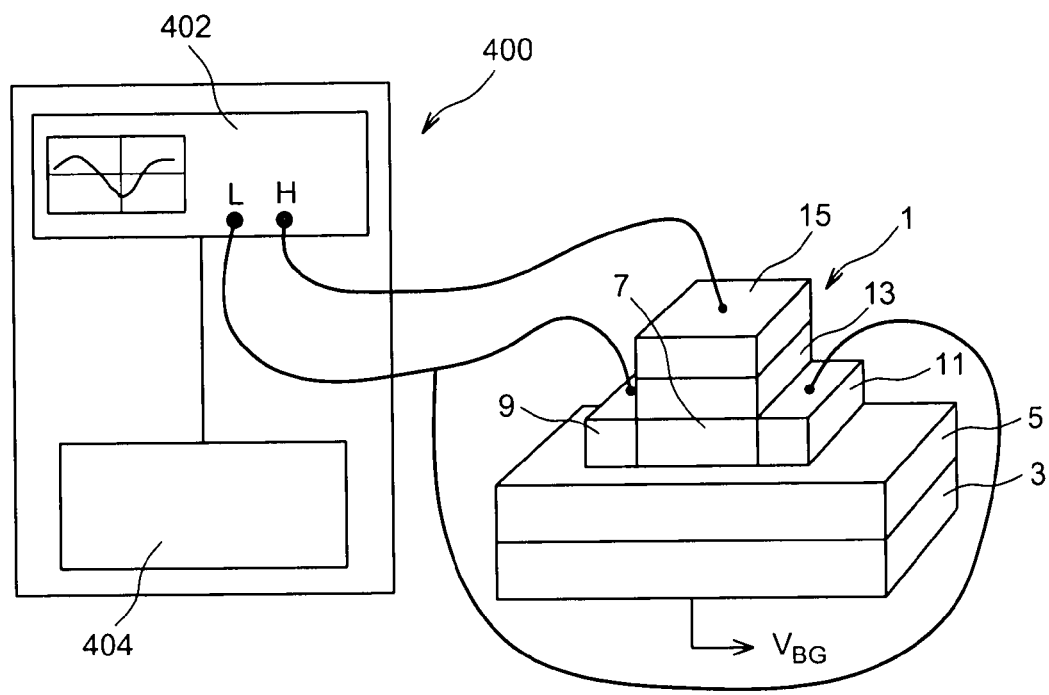

The present invention will be better understood upon reading the description of exemplary embodiments given purely as an indication and by no means as a limitation with reference to the appended drawings wherein:

FIG. 1 illustrates a transistor of the FDSOI type,

FIG. 2 illustrates the G(Vg) characteristic of a FDSOI transistor for zero substrate voltage, FIGS. 3 and 4 respectively illustrate the characteristics $C(V_{FG})$ and $G(V_{FG})$ of an FDSOI transistor for different voltage values $V_{BG}$, obtained during the application of a method for evaluating the electric performances of this transistor, according to one particular embodiment, FIG. 5 illustrates equivalent electric circuits of a FDSOI transistor either taking into account the interface defects of the transistor or not, FIGS. 6 and 7 illustrate the characteristics $C(V_{FG})$ and $G(V_{FG})$ of the simulated transistor superposed to the measured characteristics $C(V_{FG})$ and $G(V_{FG})$ of the transistor during application of the method for evaluating the electric performances of this transistor, according to one particular embodiment, FIG. 8 illustrates a device for evaluating electric performances of an FDSOI transistor, according to one particular embodiment.

Identical, similar or equivalent parts of the different figures described hereafter bear the same numerical references so as to facilitate passing from one figure to the other.

The different parts illustrated in the figures are not necessarily illustrated according to a uniform scale, in order to make the figures more legible.

The different possibilities (alternatives and embodiments) should be understood as not being exclusive of each other but they may be combined together.

DETAILED DISCUSSION OF PARTICULAR EMBODIMENTS

In the case of a MOS transistor of the bulk type, i.e. made on a bulk semiconducting substrate, it is possible to extract the density of the defects at the front interface, i.e. at the interface between the gate dielectric and the semiconducting portion forming the channel, by using the characteristics C(Vg) (capacitance of the transistor depending on the voltage Vg applied on the gate) and G(Vg) (conductance of the transistor depending on the voltage Vg applied on the gate). Indeed, by plotting the characteristic G(Vg), a low inversion regime peak appears, this peak being proportional to the density of defects at the front interface of the transistor. In the case of an FDSOI transistor, this peak also appears on the characteristic G(Vg) of this transistor. However, this peak is proportional to the accumulation of the defects at the front and rear interfaces because the characteristic G(Vg) is directly related to the electron density at the front and rear interfaces.

FIG. 2 illustrates the characteristic G(Vg) of an FDSOI transistor, for example the transistor 1 illustrated in FIG. 1. This characteristic represents the value of the conductance of the transistor 1, in $S/m^2$, depending on the voltage Vg applied on the gate 15 of the transistor 1, in volts, for zero rear face voltage $V_{BG}$ (voltage applied on the substrate 3 of the transistor 1). In FIG. 2 it is seen that the peak appears for a voltage Vg equal to about 0.1 V.

It is therefore seen that it is not possible to evaluate from the curve plotted in FIG. 2, each of the defect densities of the interfaces of the FDSOI transistor 1.

A method for evaluating the electric performances of the FDSOI transistor 1 is now detailed, with which it is possible to characterize the defects present at the interface between the gate dielectric 13 of the transistor 1 and the semiconductor 7 intended to form the channel of the transistor 1 (front interface) and at the interface between the semiconductor 7 and the buried dielectric 5 of the transistor 1 (rear interface).

This method includes two phases:

a first phase for decorrelating the electric response of the defects of the front interface of the transistor 1 from that of the defects of the rear interface of the transistor 1, a second phase for electric modeling of the transistor 1 which will then, by comparing the previous measurements and the calculated theoretical values of the capacitance and/or of the conductance of the modeled transistor for different selected values of the defect densities, allow evaluation of the real values of the defect densities of the front and rear interfaces of the transistor FDSOI 1, the performances of which are evaluated.

The first decorrelation phase is achieved by measuring the capacitance and the conductance of the transistor 1 depending on the value of a voltage $V_{FG}$ applied on the gate 15, with a voltage $V_{BG}$ applied on the rear face of the transistor 1, i.e. on the substrate 3, which is greater than 0 when the transistor 1 is of the NMOS type, and which is less than 0 when the transistor 1 is of the PMOS type. This physically corresponds in the transistor 1 to separate the inversion of the channel at the front and rear interfaces.

These measurements are conducted by electrically connecting the source 9 to the drain 11, by applying the voltage $V_{FG}$ between the gate 15 and the source 9, and by applying the voltage $V_{BG}$ on the substrate 3 via an outer voltage source. The measurements of capacitance and conductance are conducted with an impedance analyzer, for example of the HP4184 Agilent type or equivalent, the High input is connected to the gate 15 and the Low input is connected to the source 9 of the transistor 1. The voltage $V_{FG}$ comprises a DC component, the value of which is varied, for example between about −2 V and +2 V, in order to conduct measurements of the capacitance and conductance of the transistor 1, as well as an alternating component with an amplitude comprised between about 30 mV and 40 mV and with a frequency for example comprised between about 10 kHz and 100 kHz, and for example set to 100 kHz.

In the example described herein, the measurements of the capacitance and conductance of the FDSOI transistor 1, which for example is of the NMOS type, are conducted for three different voltage values $V_{BG}$ corresponding to an electric field $E_{ox}=V_{BG}/T_{ox}$ in the buried dielectric 5 comprised between about 1.5 and 2 MV/cm, $T_{ox}$ being the thickness of the buried dielectric 5 which here is equal to about 145 nm. The measurements are therefore conducted for $V_{BG}=10$ V, 20 V and 30 V. Further, for reasons of illustration, these measurements are also conducted for $V_{BG}=0$ V. In the case of a transistor of the PMOS type, the measurements may be conducted for $V_{BG}=-10$ V, −20 V and −30 V.

In FIG. 3, the curves 102, 104 and 106 illustrate the characteristics $C(V_{FG})$ (in µF/cm$^2$, $V_{FG}$ being expressed in volts) for a voltage $V_{BG}$ equal to 30 V, 20 V and 10 V respectively. It is seen that each of these curves consist of a first inflection point 108 followed by a first slope 110 corresponding to the inversion occurring at the rear interface of the FDSOI transistor 1. This first slope 110 is followed by a second inflection point 112 itself followed by a second slope 114 corresponding to the inversion occurring at the front interface of the FDSOI transistor 1. For these three curves, it is seen that a transition phase between both of these slopes corresponds to a capacitance equal to about 0.6 µF/cm$^2$.

By comparison, the curve 115 illustrates the characteristic $C(V_{FG})$ for a voltage $V_{BG}=0$. It is seen that this curve only includes a single inflection point 117 and only a single slope 119 corresponding to the inversion simultaneously occurring at the front and rear interfaces of the FDSOI transistor 1.

In FIG. 4, the curves 116, 118, 120 and 122 illustrate the characteristics $G(V_{FG})$ (in S/m$^2$, with $V_{FG}$ in volts) for a voltage $V_{BG}$ equal to 30 V, 20 V, 10 V and 0 V respectively. It is seen that the curves 116 and 118 each include two distinct peaks 124 and 126 appearing during the low inversion at the rear and front interfaces respectively, both of these peaks being characteristic of the defects present at the rear and front interfaces of the FDSOI transistor 1. For $V_{BG}=30$ V, the first peak 124 appears at $V_{FG}$ equal to about −1.05 V and the second peak 126 appears at $V_{FG}$ equal to about −0.1 V. For $V_{BG}=20$ V, the first peak 124 appears at $V_{FG}$ equal to about −0.65 V and the second peak 126 appears at $V_{FG}$ equal to about −0.1 V. On the other hand, for the curves 120 and 122, a single peak appears.

It is seen that a voltage $V_{BG}$ equal to 0 V or 10 V is not suitable for being able to evaluate individually the defect densities at the front and rear interfaces of the FDSOI transistor 1 from the conductance of the transistor 1.

Thus, among the three voltages $V_{BG}>0$ for which the characteristics $C(V_{FG})$ and $G(V_{FG})$ have been plotted (10, 20 and 30 volts), only one of these voltages is retained. This voltage is selected so that it causes the appearance on the characteristic $G(V_{FG})$, of 2 distinct conductance peaks which correspond to the electric responses of the defects at the front and rear interfaces of the transistor 1. For the example described earlier in connection with FIG. 4, the selected $V_{BG}$ voltage may indifferently be 20 volts or 30 volts since for both of these voltages, the two peaks appear clearly.

Thus, the step for measuring the capacitance and the conductance of the FDSOI transistor 1 may therefore be applied either by selecting from the beginning a suitable value $V_{BG}>0$, i.e. which causes the appearance of two peaks on the characteristic $G(V_{FG})$, or by conducting these measurements for different values of $V_{BG}>0$, and then by selecting from the latter the most suitable value of $V_{BG}$, for example the one causing the most distinct appearance of two peaks on the characteristic $G(V_{FG})$.

The conducted measurements of the capacitance $C(V_{FG})$ and conductance $G(V_{FG})$ of the FDSOI transistor 1 therefore allow the admittance Y of the FDSOI transistor 1 to be obtained as:

$$Y = G(V_{FG}) + j\omega C(V_{FG}) \quad (1)$$

The second phase of the method consists of simulating the characteristics $C(V_{FG})$ and $G(V_{FG})$ obtained at voltage $V_{BG}$ selected from an electric circuit equivalent to the FDSOI transistor 1 for different selected theoretical values of defect densities at the front and rear interfaces of the simulated transistor, in order to then determine the real values of the defect densities at the front and rear interfaces of the FDSOI transistor 1. The equivalent electric circuit established for modeling the response of defects of interfaces as well as the associated equivalent admittance (the admittance consisting of the capacitance and of the conductance) is illustrated in FIG. 5.

In this FIG. 5, the circuit 200 corresponds to the equivalent electric circuit of the FDSOI transistor without considering the defects of front and rear interfaces of the transistor. The capacitance 202, called $C_{ox}$, represents the capacitance formed by the gate dielectric of the transistor. This capacitance 202 is electrically connected in series with two other capacitances 204 and 206 which are electrically connected together in parallel and which represent the inversion capacities $C_{inv1}$ and $C_{inv2}$ in the semiconductor intended to form the channel of the modeled transistor respectively on the side of the front and rear interfaces of the modeled transistor.

The admittance $Y_a$ of the circuit 200 is equal to:

$$Y_a = [(j\omega C_{ox})^{-1} + (j\omega (C_{inv1} + C_{inv2}))^{-1}]^{-1} \quad (2)$$

The circuit 300 corresponds to the equivalent electric circuit of the FDSOI transistor when considering the front and rear interface defects.

It is this equivalent electric circuit 300 which is considered in the method for evaluating the electric performances of the FDSOI transistor 1. The defects of the front interface are modeled by a capacitance 208, called $C_{it1}$, connected in parallel to a conductance 210 called $G_{it1}$ and which is itself connected in parallel to the capacitance 204 $C_{inv1}$. The rear interface defects are modeled by capacitance 212, called $C_{it2}$, connected in parallel to a conductance 214 called $G_{it2}$.

The capacitance 212 $C_{it2}$ is connected in parallel to the capacitance 206 $C_{inv2}$.

Indeed, the total charge $Q_{tot}$ of the circuit 300 corresponds to the sum of the inversion charges at the front interface $Q_{inv1}$ and at the rear interface $Q_{inv2}$, of the charges of the depleted silicon portion $Q_{dep}$ and of the charges induced by the defects of the front interface $Q_{it1}$ and of the rear interface $Q_{it2}$:

$$Q_{tot} = Q_{it1} + Q_{inv1} + Q_{dep} + Q_{inv2} + Q_{it2}$$

By differentiating $Q_{tot}$ relatively to the front surface potential $\Psi_{S1}$, the total capacitance is inferred therefrom:

$$C_{tot} = \frac{dQ_{tot}}{d\Psi_{S1}} = C_{it1} + C_{inv1} + C_{inv2} + C_{it2}$$

The sum of 4 capacitances is therefore obtained (as the silicon portion is completely depleted, one therefore has $$\frac{dQ_{dep}}{d\Psi_{S1}} = 0),$$

which is electrically equivalent to 4 capacitances connected in parallel. In order to model the conductance peaks, each of the capacitances illustrating the response of the interface defects ($C_{it1}$ and $C_{it2}$) is associated with a conductance, called $G_{it1}$ and $G_{it2}$, respectively.

The admittance $Y_m$ of the circuit 300 is therefore equal to:

$$Y_m = [(j\omega C_{ox})^{-1} + (j\omega (C_{inv1} + C_{inv2} + C_{it1} + C_{it2}) + G_{it1} + G_{it2})^{-1}]^{-1} \quad (3)$$

By calculating the theoretical values of the different elements of the admittance $Y_m$, it will therefore be possible to calculate the theoretical values of the capacitance $C_m$ and/or of the conductance $G_m$ of the modeled transistor corresponding to the equivalent electric circuit 300 since:

$$Y_m = G_m + j\omega C_m \quad (4)$$

These values are calculated by using a software of the Poisson Schrödinger solver type, for example the software SCHRED, and a mathematical calculation software for example MATHCAD® software.

The input parameters of the software of the Poisson Schrödinger solver type are: the thickness $T_{Si}$ of the silicon portion forming the channel of the modeled transistor, for example equal to 15 nm, and its doping Na, for example equal to $10^{15}/cm^3$, the $SiO_2$ equivalent oxide thickness EOT of the modeled transistor, for example comprised between about 1 nm and 2 nm (the calculation of the EOT of a transistor being described for example in document EP 1 591 558), and the voltage value $V_{BG}$ selected during measurements on the FDSOI transistor 1.

From these input parameters, the software may then calculate the electron concentration n(x) and the potential $\Psi(x)$ at depth x in the silicon portion intended to form the channel, this step being comprised between 0 and $T_{Si}$. It is therefore possible to calculate the surface potentials at the front interface $\Psi_{S1} = \Psi(0)$ and at the rear interface $\Psi_{S2} = \Psi(T_{Si})$, as well as the electron concentrations at these interfaces: $n_{S1} = n(0)$ and $n_{S2} = n(T_{Si})$.

By considering the profiles of the constant interface defects in the silicon gap, both capacitances $C_{it1,2}$ and both conductances $G_{it1,2}$ at the interfaces of the modeled transistor are written as:

$$C_{it1,2} = e \cdot D_{it1,2} \frac{\arctan(\omega \tau_{1,2})}{\omega \tau_{1,2}} \quad (5)$$

$$G_{it1,2} = e \cdot D_{it1,2} \frac{\ln(1 + (\omega \tau_{1,2})^2)}{2\omega \tau_{1,2}} \quad (6)$$

with $\omega$: the angular frequency of the alternating sinusoidal component of the voltage $V_{FG}$ applied to the modeled transistor (equal to $2\pi \cdot 10^5$ for a frequency of 100 kHz);

$\tau_{1,2}$: characteristic life times of the defects $\tau_1$ and $\tau_2$ at the front and rear interfaces of the modeled transistor;

e: electric charge.

Now, the life times $\tau_{1,2}$ may be calculated according to the equation:

$$\tau_{1,2} = \sigma_{1,2} \cdot v_{th} \cdot n_{S1,2} \quad (7)$$

wherein $\sigma_{1,2}$ is the capture cross-section at the interfaces of the modeled transistor (for example comprised between about $10^{-14}$ cm² and $10^{-18}$ cm²) and $v_{th}$ is the thermal velocity of the charge carriers (for example equal to $10^5$ cm$^{-2}$).

Given that the parameters $\Psi_{S1}$, $\Psi_{S2}$, $n_{S1}$ and $n_{S2}$ have been calculated beforehand, it is possible to calculate the parameters $\tau_1$ and $\tau_2$ and to therefore infer therefrom the values of $C_{it1,2}$ and $G_{it1,2}$ by selecting different theoretical values of $D_{it1,2}$.

In parallel with this, and from the electron concentration n(x) calculated previously, the inversion charges in the front $Q_{inv1}$ and rear $Q_{inv2}$ faces are calculated by integrating the charge $-e \cdot n(x)$ over half of the silicon portion forming the channel, i.e. between x=0 and x=$T_{Si}/2$ for $Q_{inv1}$ and between x=$T_{Si}/2$ and x=$T_{Si}$ for $Q_{inv2}$:

$$Q_{inv1} = -e \int_0^{T_{Si}/2} n(x) dx \text{ et } Q_{inv2} = -e \int_{T_{Si}/2}^{T_{Si}} n(x) dx \quad (8)$$

By differentiating both of these parameters relatively to the front surface potential $\Psi_{S1}$ and rear surface potential $\Psi_{S2}$, values of the two inversion capacitances $C_{inv1}$ and $C_{inv2}$ are obtained:

$$C_{inv1,2} = \frac{dQ_{inv1,2}}{d\Psi_{S1,2}} \quad (9)$$

From the elements calculated previously, it is therefore possible to calculate the admittance $Y_m$, and therefore calculate the capacitance $C_m$ and the conductance $G_m$ of the simulated transistor for the different values of $D_{it1,2}$ selected previously.

In FIG. 6, the curves 128 and 130 illustrate the characteristics $C(V_{FG})$ of the simulated transistor for $V_{BG}$=30 V and 20 V respectively and for the values $D_{it1}$=3.10$^{10}$ cm$^{-2}$eV$^{-1}$ and $D_{it2}$=5.10$^{11}$ cm$^{-2}$eV$^{-1}$.

In this figure, curves 128 and 130 are superposed to the curves 102 and 104 corresponding to the characteristics $C(V_{FG})$ measured for $V_{BG}$=30V and 20 V (see FIG. 3). It is seen that the curves 102 and 128 actually include two inflection points 129 and 131 which are superposed, as well as for the curves 104 and 130, which means that these selected theoretical values of $D_{it1}$ and $D_{it2}$ actually correspond to the real values of $D_{it1}$ and $D_{it2}$ of the FDSOI transistor 1.

In FIG. 7, the curve 132 illustrates the characteristic $G(V_{FG})$ of the simulated transistor for $V_{BG}$=30 V and for the values $D_{it1}=3.10^{10}$ cm$^{-2}$eV$^{-1}$ and $D_{it2}=5.10^{11}$ cm$^{-2}$eV$^{-1}$. There again, the curve 132 is superposed to the curve 116 corresponding to the characteristic $G(V_{FG})$ measured for $V_{BG}$=30 V (see FIG. 4). The curves 132 and 116 actually include two peaks 134 and 136 which are superposed, which means that the selected theoretical values of $D_{it1}$ and $D_{it2}$ actually correspond to the real values of $D_{it1}$ and $D_{it2}$ of the FDSOI transistor 1.

The selection of the characteristics $C(V_{FG})$ and $G(V_{FG})$ of the simulated transistor, for which the peaks or the inflection points are at best superposed to those of the measured characteristics $C(V_{FG})$ and $G(V_{FG})$, which therefore corresponds to the determination of the real values of $D_{it1}$ and $D_{it2}$, may be made automatically by means of a calculation software.

The method for evaluating the electric performances of the FDSOI transistor 1 was described earlier by using the capacitance and the conductance of the FDSOI transistor 1 and of the simulated transistor in order to find the real values of $D_{it1}$ and $D_{it2}$ of the FDSOI transistor 1. However, it is quite possible to only use the conductance, or the capacitance, for again finding the real values of $D_{it1}$ and $D_{it2}$ of the FDSOI transistor 1. Further, it is also possible to carry out several times this evaluation method by using every time a different frequency for the alternating component of the voltage $V_{FG}$ if confirmation of the obtained results is desired.

From the values obtained of $D_{it1}$ and $D_{it2}$, it is therefore possible to determine the level of the performances of the FDSOI transistor 1. It may notably be considered that a defect density of less of about $1.10^{11}$ cm$^{-2}$eV$^{-1}$ is a value indicating that the interface is of good quality (case of the rear interface of the FDSOI transistor 1: $D_{it1}=3.10^{10}$ cm$^{-2}$eV$^{-1}$) and that a defect density of more than about $1.10^{11}$ cm$^{-2}$eV$^{-1}$ indicates that the interface is degraded (case of the front interface of the FDSOI transistor 1: $D_{it2}=5.10^{11}$ cm$^{-2}$eV$^{-1}$).

The method described earlier may be applied by a device 400 illustrated in FIG. 8 including an impedance analyzer 402 as well as computing means 404 performing the calculations relating to the modeling of the FDSOI transistor 1. The computing means 404 may notably be a computer on which the software described earlier may be executed.

The invention claimed is:

1. A method for evaluating the electric performances of an FDSOI transistor, including the steps of:
   measuring capacitance and/or conductance of the FDSOI transistor, by applying a voltage $V_{BG}$>0 on a substrate composed of semiconductor of the FDSOI transistor when the FDSOI transistor is NMOS or a voltage $V_{BG}$<0 on the substrate composed of semiconductor of the FDSOI transistor when the FDSOI transistor is PMOS, depending on a voltage $V_{FG}$ applied between a gate and source and drain regions of the FDSOI transistor,
   calculating theoretical values of capacitance and/or conductance of a transistor modeled by an electric circuit equivalent to the FDSOI transistor, depending on values of the voltages $V_{FG}$ and $V_{BG}$ applied to the modeled transistor and for different selected theoretical values of defect densities $D_{it1}$, $D_{it2}$ at an interface between a gate dielectric of the modeled transistor and a semiconductor intended to form the channel of the modeled transistor and an interface between the semiconductor intended to form the channel of the modeled transistor and a buried dielectric of the modeled transistor respectively, and
   determining real values of the defect densities $D_{it1}$, $D_{it2}$ at the corresponding interfaces of the FDSOI transistor by a comparison between the measured values of the capacitance and/or of the conductance of the FDSOI transistor and the calculated theoretical values of the capacitance and/or of the conductance of the modeled transistor for the different selected theoretical values of the defect densities $D_{it1}$, $D_{it2}$ at the interfaces of the modeled transistor.

2. The method according to claim 1, wherein the voltage $V_{FG}$ includes a DC component, a value of which is comprised between about −2 V and 2 V and an alternating sinusoidal component, and a frequency of which is comprised between about 10 kHz and 100 kHz.

3. The method according to claim 1, wherein the value of the voltage $V_{BG}$ is selected so that a curve illustrating the measured conductance of the FDSOI transistor depending on the voltage $V_{FG}$ includes at least two peaks.

4. The method according to claim 1, wherein the voltage $V_{BG}$ is a DC voltage, a value of which is comprised between about 15 V and 30 V when the FDSOI transistor is NMOS or comprised between about −15 V and −30 V when the FDSOI transistor is PMOS.

5. The method according to claim 1, wherein the capacitance and/or the conductance of the FDSOI transistor are measured by an impedance analyzer.

6. The method according to claim 1, wherein the electric circuit equivalent to the FDSOI transistor includes a first capacitance electrically connected in series with a set of components electrically connected in parallel with each other, said set of components including four capacitances, corresponding to inversion capacitances in the semiconductor intended to form the channel of the modeled transistor on the side of said interfaces of the modeled transistor and to capacitances of the defects at said interfaces of the modeled transistor, and two conductances, corresponding to conductances of the defects at said interfaces of the modeled transistor.

7. The method according to claim 1, wherein the calculated theoretical values of the capacitance and/or of the conductance are obtained by applying the following steps:
   calculating theoretical values of electron concentrations $n_{s1}$ and $n_{s2}$ at the interfaces of the modeled transistor,
   calculating theoretical characteristic life-time values of the defects $\tau_1$ and $\tau_2$ at the interfaces of the modeled transistor such that:

$$\tau_{1,2} = \sigma_{1,2} \cdot v_{th} \cdot n_{S1,2}$$

calculating theoretical values of capacitances $C_{it1}$ and $C_{it2}$ at the interfaces of the modeled transistor for the different selected theoretical values of $D_{it1}$ and $D_{it2}$ such that:

$$C_{it1,2} = e \cdot D_{it1,2} \frac{\arctan(\omega \tau_{1,2})}{\omega \tau_{1,2}}$$

calculating theoretical values of conductances $G_{it1}$ and $G_{it2}$ at the interfaces of the modeled transistor for the different selected theoretical values of $D_{it1}$ and $D_{it2}$ such that:

$$G_{it1,2} = e \cdot D_{it1,2} \frac{\ln(1 + (\omega \tau_{1,2})^2)}{2\omega \tau_{1,2}}$$

calculating theoretical values of inversion charges $Q_{inv1}$ and $Q_{inv2}$ in the semiconductor intended to form the channel of the modeled transistor, respectively on a side of each of the interfaces of the modeled transistor so that:

$$Q_{inv1} = -e \int_0^{TSi/2} n(x)dx \text{ et } Q_{inv2} = -e \int_{TSi/2}^{TSi} n(x)dx$$

calculating the theoretical values of electric potentials $\Psi_{S1}$ and $\Psi_{S2}$ in the semiconductor intended to form the channel of the modeled transistor, respectively on the side of each of the interfaces of the modeled transistor, calculating theoretical values of inversion capacitances $C_{inv1}$ and $C_{inv2}$ in the semiconductor intended to form the channel of the modeled transistor, respectively on the side of each of the interfaces of the modeled transistor such that:

$$C_{inv1,2} = \frac{dQ_{inv1,2}}{d\Psi_{S1,2}}$$

calculating theoretical value of the admittance $Y_m$ of the modeled transistor such that:

$Y_m = [(j\omega C_{ox})^{-1} + (j\omega(C_{inv1} + C_{inv2} + C_{it1} + C_{it2}) + G_{it1} + G_{it2})^{-1}]^{-1} = G_m + j\omega C_m$ with:
- $\sigma_{1,2}$: capture cross-sections at the interfaces of the modeled transistor;
- $v_{th}$: thermal velocity of the charge carriers;
- $\omega$: angular frequency of an alternating sinusoidal component of the voltage $V_{FG}$ applied to the modeled transistor;
- $n(x)$: electron concentration at depth x in the semiconductor intended to form the channel of the modeled transistor;
- $C_{ox}$: capacitance of the gate dielectric of the modeled transistor;
- $C_m$: capacitance of the modeled transistor;
- $G_m$: conductance of the modeled transistor;
- $T_{si}$: thickness of the semiconductor intended to form the channel of the transistor.

8. The method according to claim 7, wherein the theoretical values of the electron concentrations $n_{s1}$ and $n_{s2}$ and of the electric potentials $\Psi_{S1}$ and $\Psi_{S2}$ at the interfaces of the modeled transistor are calculated by a software of Poisson Schrödinger solver from values of thickness of the semiconductor intended to form the channel of the modeled transistor, from doping of said semiconductor, from an $SiO_2$ equivalent oxide thickness EOT of the modeled transistor, and from the voltage $V_{BG}$.

9. The method according to claim 1, wherein the comparison between the measured conductance of the FDSOI transistor and the calculated theoretical conductance of the modeled transistor is made by plotting and by superposing curves of these conductances depending on the voltage $V_{FG}$, and then by determining the selected theoretical values of the defects densities $D_{it1}$, $D_{it2}$ at the interfaces of the modeled transistor for which the curve of the calculated theoretical conductance includes two peaks substantially superposed to two peaks of the curve of the measured conductance.

10. The method according to claim 1, wherein the comparison between the measured capacitance of the FDSOI transistor and the calculated theoretical capacitance of the modeled transistor is made by plotting and by superposing curves of these capacitances depending on the voltage $V_{FG}$, and then by determining the selected theoretical values of the defect densities $D_{it1}$, $D_{it2}$ at the interfaces of the modeled transistor for which the curve of the calculated theoretical capacitance includes two inflection points substantially superposed to two inflection points of the curve of the measured capacitance.

11. A device for evaluating the electric performances of an FDSOI transistor, said device comprising:
- an impedance analyzer that measures capacitance and/or conductance of the FDSOI transistor, by applying a voltage $V_{BG} > 0$ on a substrate composed of semiconductor of the FDSOI transistor when the FDSOI transistor is NMOS or a voltage $V_{BG} < 0$ on the substrate composed of semiconductor of the FDSOI transistor when the FDSOI transistor is PMOS, depending on a voltage $V_{FG}$ applied between a gate and source and drain regions of the FDSOI transistor, and
- a computer that calculates theoretical values of the capacitance and/or the conductance of a transistor modeled by an electric circuit equivalent to the FDSOI transistor, depending on values of the voltages $V_{FG}$ and $V_{BG}$ applied to the modeled transistor and for different selected theoretical values of defect densities $D_{it1}$, $D_{it2}$ at an interface between a gate dielectric of the modeled transistor and a semiconductor intended to form the channel of the modeled transistor and an interface between the semiconductor intended to form the channel of the modeled transistor and a buried dielectric of the modeled transistor respectively,
- wherein the computer determines real values of the defect densities $D_{it1}$, $D_{it2}$ at the corresponding interfaces of the FDSOI transistor by a comparison between the measured values of the capacitance and/or of the conductance of the FDSOI transistor and the calculated theoretical values of the capacitance and/or of the conductance of the modeled transistor for the different selected theoretical values of the defect densities $D_{it1}$, $D_{it2}$ at the interfaces of the modeled transistor.

* * * * *